(12) United States Patent
Xie

(10) Patent No.: US 11,636,302 B2
(45) Date of Patent: Apr. 25, 2023

(54) RFID TAG INFORMATION READING APPARATUS AND METHOD

(71) Applicant: QUECLINK WIRELESS SOLUTIONS CO., LTD., Shanghai (CN)

(72) Inventor: Xiaohua Xie, Shanghai (CN)

(73) Assignee: QUECLINK WIRELESS SOLUTIONS CO., LTD., Shanghai (CN)

( * ) Notice: Subject to any disclaimer, the term of this patent is extended or adjusted under 35 U.S.C. 154(b) by 0 days.

(21) Appl. No.: 17/852,270

(22) Filed: Jun. 28, 2022

(65) Prior Publication Data

US 2022/0327343 A1 Oct. 13, 2022

Related U.S. Application Data

(63) Continuation of application No. PCT/CN2020/140371, filed on Dec. 28, 2020.

(30) Foreign Application Priority Data

Dec. 31, 2019 (CN) .......................... 201911406086.7

(51) Int. Cl.
G06K 19/07 (2006.01)
G06K 7/00 (2006.01)
G06K 19/073 (2006.01)

(52) U.S. Cl.
CPC ....... *G06K 19/0723* (2013.01); *G06K 7/0008* (2013.01); *G06K 19/073* (2013.01)

(58) Field of Classification Search
CPC . G06K 19/0723; G06K 7/0008; G06K 19/073
See application file for complete search history.

(56) References Cited

U.S. PATENT DOCUMENTS

| | | | |
|---|---|---|---|
| 6,317,027 B1 * | 11/2001 | Watkins | G06K 7/0008 340/10.3 |
| 2005/0030108 A1 * | 2/2005 | Duncan | H03G 1/0029 331/16 |

(Continued)

FOREIGN PATENT DOCUMENTS

| | | |
|---|---|---|
| CN | 1523764 A | 8/2004 |
| CN | 101377808 A | 3/2009 |

(Continued)

OTHER PUBLICATIONS

First Office Action of CN201911406086.7.

(Continued)

*Primary Examiner* — Omer S Khan
(74) *Attorney, Agent, or Firm* — J.C. Patents

(57) ABSTRACT

Provided are an RFID tag information reading apparatus and method, including a signal management circuit, configured to output an operation frequency signal; a resonant circuit, configured to receive the operation frequency signal, adjust a capacitance value and an inductance value of the resonant circuit according to the operation frequency signal, so that the resonant circuit generates a resonance for generating a sine wave signal at a frequency point of the operation frequency signal, the resonant circuit is further configured to generate an electromagnetic wave from the sine wave signal, radiate the electromagnetic wave to a tag, and trigger the tag to return a tag identity signal; and a decoding identification circuit, configured to identify tag information according to the tag identity signal returned by the tag; where the signal management circuit is connected with the resonant circuit, and the resonant circuit is connected with the decoding identification circuit.

8 Claims, 5 Drawing Sheets

(56) References Cited

U.S. PATENT DOCUMENTS

| | | | | |
|---|---|---|---|---|
| 2006/0186995 A1* | 8/2006 | Wu | ............... | G06K 7/0008 340/572.1 |
| 2007/0013483 A1* | 1/2007 | Stewart | ............... | G06K 7/0008 343/745 |
| 2007/0145830 A1* | 6/2007 | Lee | ............... | G01V 3/104 307/135 |

FOREIGN PATENT DOCUMENTS

| | | |
|---|---|---|
| CN | 102129603 A | 7/2011 |
| CN | 104318274 A | 1/2015 |
| CN | 105184351 A | 12/2015 |
| CN | 106341164 A | 1/2017 |
| CN | 108319876 A | 7/2018 |
| CN | 108416242 A | 8/2018 |
| CN | 110334556 A | 10/2019 |
| CN | 111178105 A | 5/2020 |
| EP | 1770665 A1 | 4/2007 |
| WO | WO2007024416 A2 | 3/2007 |
| WO | WO2017150649 A1 | 9/2017 |

OTHER PUBLICATIONS

Notice of Allowance of CN201911406086.7.
International Search Report for PCT/CN2020/140371.
Extended European Search Report of the parallel application EP20909315.2.

* cited by examiner

RFID TAG INFORMATION READING APPARATUS AND METHOD

CROSS-REFERENCES TO RELATED APPLICATIONS

This application is a continuation of International Application No. PCT/CN2021/140371, filed on Dec. 28, 2020, which claims priority to Chinese patent application No. 201911406086.7, filed on Dec. 31, 2019 and entitled "RFID TAG INFORMATION READING DEVICE AND METHOD". The contents of the above applications are hereby incorporated by reference in their entireties.

TECHNICAL FIELD

Embodiments of the present disclosure relate to the field of radio frequency identification technology, in particular to a radio frequency identification (RFID) tag information reading apparatus and method.

BACKGROUND

A complete RFID tag identification system consists of three parts: reader, electronic tag (TAG) and application software. Its basic working principle is: firstly, the reader transmits a wireless electromagnetic wave of fixed frequency point to the TAG to drive a TAG circuit to send out an internal stored data. At this time, the reader receives decoded data in order, and then displays a corresponding processing through the application software.

RFID tag identification technology has been applied for many years at home and abroad, and has been widely used in all walks of life and different occasions. An operation frequency band is divided into low frequency, high frequency and ultra-high frequency, and the electronic tag is also divided as passive and active. Low-frequency and passive tags are mainly used in bus cards, subway cards, canteen meal cards, merchant membership cards, access control cards, second-generation identification (ID) cards and parking cards, etc. Operation frequency of its product is mainly 125 kHz and 134.2 khz.

An inventor found that current readers for reading passive tags at low frequency in a market generally use integrated chips to complete electromagnetic wave transmission and data decoding. Parameters of a product cannot be adjusted, a performance cannot be improved, and a transmission power cannot be improved. Readers for reading passive tags at low frequency need to be attached to or close to the reader to obtain information and data. An existing reading distance in the market is generally between 5-8 cm. When the card (tag) is far away from the reader, it is difficult to read or even can not be read, so there are considerable limitations in the reading distance.

SUMMARY

The purpose of the embodiments of the present disclosure is to provide an RFID tag information reading apparatus and method, so that the RFID reading device in the embodiments of the present application can generate a resonance by adjusting parameters of a resonant circuit, thereby enhancing a transmission power and effectively improving a reading distance of a reader.

In order to solve the above technical problems, an embodiment of the present disclosure provides an RFID tag information reading apparatus, including: a signal management circuit, a resonant circuit and a decoding identification circuit; where the signal management circuit is connected with the resonant circuit, and the resonant circuit is connected with the decoding identification circuit; the signal management circuit is configured to output an operation frequency signal; the resonant circuit is configured to receive the operation frequency signal, adjust a capacitance value and an inductance value of the resonant circuit according to the operation frequency signal, so that the resonant circuit generates a resonance for generating a sine wave signal at a frequency point of the operation frequency signal; the resonant circuit is further configured to generate an electromagnetic wave from the sine wave signal, radiate the electromagnetic wave to an RFID tag, and trigger the RFID tag to return a tag identity signal; the decoding identification circuit is configured to identify RFID tag information according to the tag identity signal returned by the RFID tag.

An embodiment of the present disclosure also provides an RFID tag information reading method, applied to an RFID tag reading device, and the RFID tag reading apparatus includes: a signal management circuit, a resonant circuit and a decoding identification circuit; the signal management circuit is connected with the resonant circuit, and the resonant circuit is connected with the decoding identification circuit; the RFID tag reading method includes: outputting an operation frequency signal through the signal management circuit; receiving the operation frequency signal through the resonant circuit, adjusting a capacitance value and an inductance value of the resonant circuit according to the operation frequency signal, and generating a resonance for generating a sine wave signal at a frequency point of the operation frequency signal; generating an electromagnetic wave from the sine wave signal through the resonant circuit, radiating the electromagnetic wave to an RFID tag, and triggering the RFID tag to return a tag identity signal; and identifying RFID tag information through the decoding identification circuit according to the tag identity signal returned by the RFID tag.

An embodiment of the present disclosure adopts a discrete electronic component circuit, that is, a tag reading apparatus composed of a signal management circuit, a resonant circuit and a decoding identification circuit. The apparatus adjusts capacitance value and inductance value parameters of the resonant circuit to match a frequency point frequency of an input operation frequency signal, thereby generating a resonance on the resonant circuit. A sine wave signal generated by the resonance is used to generate an electromagnetic wave, and the electromagnetic wave is radiated to an RFID tag, which triggers the RFID tag to feed back a tag identity signal, and the decoding identification circuit identifies tag information through the fed back tag identity signal. The embodiment of the present disclosure can generate a resonance by adjusting parameters of the resonant circuit, so as to enhance a transmission power and effectively improve a reading distance of a reader.

In addition, an RFID tag information reading apparatus according to an embodiment of the present disclosure further includes a capacitance dynamic adjustment circuit and a processing unit, where the resonant circuit is respectively connected with the capacitance dynamic adjustment circuit and the processing unit, and the capacitance dynamic adjustment circuit includes multiple groups of capacitors; the capacitance dynamic adjustment circuit is configured to connect any group number of capacitors of the multiple groups of capacitors to the resonant circuit respectively to obtain M groups of access resonant capacitors with different capacitance values, and the resonant circuit obtains M groups of different sine wave signals according to the M groups of different access resonant capacitors; the processing unit determines a resonant capacitance of the resonant circuit according to a maximum value of the M groups of sine wave signals, where an inductance value of the resonant circuit is set to a fixed value. In this embodiment, different access resonant capacitors are connected to the capacitance dynamic adjustment circuit to obtain a coil voltage on different resonant circuits, and an access resonant capacitor corresponding to a maximum coil voltage is determined as a resonant capacitor, which realizes the purpose of automatically obtaining an optimum access resonant capacitor, thereby enhancing a transmission power and greatly improving a reading distance.

In addition, an RFID tag information reading apparatus according to an embodiment of the present disclosure further includes a direct current (DC) release circuit, where the DC release circuit is connected with the resonant circuit; the DC release circuit is configured to release a DC component of the resonant circuit through a loop. If the DC on the coil of the resonant circuit cannot be effectively released, it will be superimposed on an alternating signal, resulting in stagnant energy storage, hindering a change of magnetic flux and affecting a transformation of magnetic energy. By releasing the DC component on the coil through the loop, an anti-interference ability of a system and a stability of the system is increased.

In addition, the signal management circuit includes a frequency divider and an external crystal oscillation circuit; the external crystal oscillation circuit is connected with the frequency divider, and is configured to provide a preset oscillation frequency input to the frequency divider; the frequency divider is configured to perform 2 to N frequency division on a crystal oscillator of the external crystal oscillation circuit to obtain a frequency point frequency of the operation frequency signal; the frequency divider includes N triggers; an output of a N−1th trigger is an input of a Nth trigger, and a frequency of an output signal of the Nth trigger is half of a frequency of an output signal of the N−1th trigger; where the operation frequency signal is an output signal of a last trigger included in the frequency divider. The circuit specifically provides a structure of the frequency divider circuit. By selecting an appropriate crystal and frequency division output, a frequency output signal we need can be realized. Since an input clock of the trigger is generated by an independent crystal, the crystal frequency is more stable and accurate than an output frequency generated by a system processing unit timer. An anti-interference ability of the trigger itself is also stronger than an internal circuit of the processing unit.

In addition, when it is detected that an idle time exceeds a first threshold, the RFID tag reading device is shut down. Through an automatic shutdown function of the tag reading device, a power consumption is effectively reduced, a standby time is increased, a volume of a battery can be reduced, and it is more convenient to carry.

BRIEF DESCRIPTION OF DRAWINGS

One or more embodiments are exemplarily described by pictures in the corresponding drawings, and these exemplified descriptions do not constitute a limitation on the embodiments.

DESCRIPTION OF EMBODIMENTS

In order to make the purpose, technical solutions and advantages of embodiments of the present disclosure clearer, the embodiments of the present disclosure will be described in detail below in combination with the accompanying drawings. However, it can be understood by those skilled in the art that many technical details have been proposed in various embodiments of the present disclosure in order to make the reader better understand the present application. However, even without these technical details and various changes and modifications based on the following embodiments, the technical solutions claimed in the present application can be realized. The following embodiments are divided for convenience of description and shall not constitute any limitation on the specific implementation mode of the present disclosure, and the embodiments can be combined and referenced with each other without contradiction.

Figure 1:
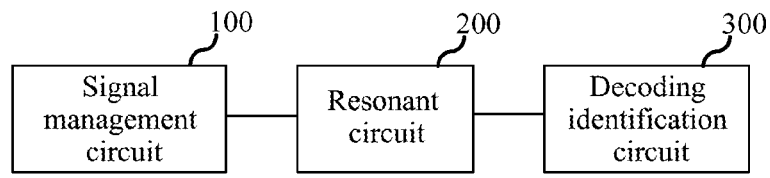
FIG. 1 is a schematic structural diagram of an RFID tag information reading apparatus according to a first embodiment of the present disclosure.

A first embodiment of the present disclosure relates to an RFID tag information reading apparatus. The specific structure is shown in FIG. 1, and the device includes: a signal management circuit 100, a resonant circuit 200 and a decoding identification circuit 300; the signal management circuit 100 is connected with the resonant circuit 200, and the resonant circuit 200 is connected with the decoding identification circuit 300; the signal management circuit 100 is configured to output an operation frequency signal; the resonant circuit 200 is configured to receive the operation frequency signal, adjust a capacitance value and an inductance value of the resonant circuit 200 according to the operation frequency signal, so that the resonant circuit 200 generates a resonance for generating a sine wave signal at a frequency point of the operation frequency signal; the resonant circuit 200 is further configured to generate an electromagnetic wave from the sine wave signal, radiate the electromagnetic wave to an RFID tag, and trigger the RFID tag to return a tag identity signal; the decoding identification circuit 300 is configured to identify RFID tag information according to the tag identity signal returned by the RFID tag.

Specifically, the operation frequency signal of the embodiment of the present disclosure is output through the signal management circuit 100. In the field of RFID technology, the operation frequency can be divided into low frequency, high frequency and ultra-high frequency, and tag reader is usually applied in the low frequency band. For example, the operation frequency is 125 kHz and 134.2 kHz.

The operation frequency signal output through the signal management circuit 100 is loaded on a LC resonant circuit (LC represents inductance and capacitance). In order to make the LC resonant circuit resonate at a frequency point of the operation frequency signal, that is, resonate at a frequency point frequency f=125 kHz or 134.2 kHz, it is necessary to adjust the capacitance value and inductance value of the LC resonant circuit. A relationship between frequency point frequency and inductance and capacitance can be expressed as $$f = \frac{1}{2\pi\sqrt{LC}},$$

that is LC are variables, that is, the frequency point frequency can be matched by changing LC. In actual product applications, considering errors of capacitance and inductance and other parasitic capacitance and inductance factors on a circuit board, there is a deviation between an actual connected capacitance and inductance and a theoretical value. If the capacitance and inductance cannot match the frequency of the frequency point, a frequency point offset will occur, which may lead to transmission loss and circuit heating, resulting in an increased decoding error and an unstable signal. In this case, it is necessary to adjust the capacitance and inductance according to the frequency of the frequency point according to an actual situation to make a resonant capacitor resonate at the frequency point. Generally speaking, to adjust the capacitance and inductance, one variable needs to be determined before adjusting another variable. In an actual product, the inductance L cannot be changed at will, and L is usually a fixed value, so only the capacitance C needs to be adjusted to match a corresponding frequency of the frequency point. After resonance occurs at the frequency point, the resonant circuit generates a high-voltage sine wave, and then transmits the high-voltage sine wave to a coil (i.e. an antenna) of the resonant circuit. A specific application of the coil can be a magnetic rod coil. According to different materials of the magnetic core, it can be divided into nickel zinc and manganese zinc magnetic cores, where a magnetic permeability of manganese zinc is higher than that of nickel zinc. Preferably, the embodiment of the present disclosure adopts the magnetic core made of manganese zinc material. The capacitance and inductance that determine an electromagnetic conversion efficiency in the resonant circuit are power devices, both of which play an important role. For the inductance value, it can neither be too large nor too small, and can be determined according to a large number of experiments. Preferably, when the inductance value L is 115 uH, the magnetic conversion effect is optimum. Therefore, the embodiment of the present disclosure uses a multi strand wire with the manganese zinc component magnetic core to wind the specific coil with an inductance value of 115 uH, so as to obtain a maximum converted magnetic energy for radiating out. In addition, a quality factor Q value of the coil also plays an important role in the electromagnetic conversion efficiency. According to a formula $$Q = 2\pi f \frac{L}{R},$$

a resonant frequency f, a inductance L and an equivalent resistance R of the coil all determine the Q value. Therefore, by considering the above factors, a maximum magnetic field conversion energy is obtained to form high-energy electromagnetic wave for radiating out.

When a passive electronic tag enters an alternating magnetic field of a tag reader, a tag circuit obtains a corresponding electromagnetic wave through coupling, so as to generate voltage and current in an internal circuit of the tag. When the voltage increases to a threshold voltage of the tag, a tag storage electronic unit circuit is started to send a tag identity signal to the tag reader, and an identification of the tag information is completed through the decoding identification circuit 300.

The embodiment of the present disclosure adopts a discrete electronic component circuit, that is, a tag reading apparatus composed of a signal management circuit, a resonant circuit and a decoding identification circuit. The apparatus adjusts capacitance value and inductance value parameters of the resonant circuit to match a frequency point frequency of an input operation frequency signal, thereby generating a resonance on the resonant circuit. A sine wave signal generated by resonance is transmitted to the coil of the resonant circuit to form an electromagnetic wave, the coil can feed back the tag identity signal through the electromagnetic wave, and the identification circuit identifies the tag information through the fed back tag identity signal. The embodiment of the present disclosure can generate a resonance by adjusting parameters of the resonant circuit, so as to enhance a transmission power and effectively improve a reading distance of a reader.

Figure 2:
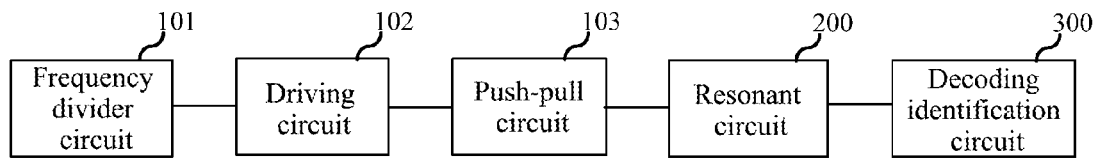
FIG. 2 is a schematic structural diagram of an RFID tag information reading apparatus according to a second embodiment of the present disclosure.

A second embodiment of the present disclosure relates to an RFID tag information reading apparatus. The second embodiment is an embodiment with a further improvement being made based on the first embodiment, and main improvement lies in: in this embodiment, a specific implementation of the signal management circuit is specifically provided. As shown in FIG. 2, the signal management circuit specifically includes a frequency divider circuit 101, a driving circuit 102 and a push-pull circuit 103. The frequency divider circuit 101 outputs a frequency division signal to the driving circuit 102, the driving circuit 102 outputs a driving signal according to the frequency division signal, the push-pull circuit 103 alternately outputs an operation frequency signal according to the driving signal, and loads the operation frequency signal to the resonant circuit 200. The resonant circuit 200 generates a resonance according to the operation frequency signal, output a high-voltage sine wave for being transmitted to a coil of the resonant circuit 200, and convert the high-voltage sine wave into an electromagnetic wave through the coil.

Specifically, the frequency divider circuit 101 is an independent frequency divider circuit, and each independent frequency divider circuit is composed of a frequency divider composed of multiple triggers and an external crystal oscillation circuit. An output of each trigger is an input of a latter trigger, and an output frequency of the latter trigger is half of an output frequency of a previous trigger. Therefore, a required frequency output signal can be obtained by selecting appropriate external crystal oscillation circuit and frequency divider. For example, when an operation frequency that need to be obtained is 134.2 kHz, a crystal oscillation circuit with a frequency of 17.1776 M crystal can be selected, and a 134.2 kHz frequency signal can be obtained after 128 frequency division through the frequency divider; by analogy, if a 16 M crystal is selected, a 125 kHz frequency signal can be obtained after 128 frequency division through the frequency divider. Because an input clock of the trigger is generated by an independent crystal, an output frequency of the crystal after frequency division is stable and has high precision, and the trigger itself has a relatively strong anti-interference ability, which also improves the anti-interference ability of the output frequency signal.

The frequency divider circuit 101 inputs the 134.2 kHz or 125 kHz signal output after frequency division to the driving circuit 102. The driving circuit 102 receives the frequency division signal and clamps the frequency division signal to generate two inversion signals with a same amplitude. The two inversion signals output the driving signal to the push-pull circuit 103 after passing through a driving device of the driving circuit 102. The driving signal includes a high-level signal and a low-level signal. The push-pull circuit 103 includes an upper P-channel metal oxide semiconductor (PMOS) power switch tube and a lower N-channel metal oxide semiconductor (NMOS) power switch tube that are longitudinally symmetrical. When the circuit is working, only one of the two symmetrical power switch tubes is turned on at a time. Specifically, the push-pull circuit 103 receives the driving signal. When the driving signal is a low-level signal, the upper PMOS tube is turned on, and a current passes through the PMOS tube to an output antenna end (i.e. coil end); when a high-level signal is output, the lower NMOS tube is turned on, and the current flows back from the antenna end through the NMOS tube to a grounding end. In this way, the PMOS tube and NMOS tube work alternately. Because an on resistance of the power tube is very small and a switching time is short, a conduction loss is small and efficiency is high. The push-pull circuit 103 loads the output alternating signal to the resonant circuit 200, and after a subsequent resonance effect, the output alternating signal is converted into a high-voltage sine wave signal for output. The high-voltage sine wave output by the resonant circuit is transmitted to the coil of the resonant circuit, and is converted into a high-energy electromagnetic wave for radiating out through the coil.

When a passive electronic tag enters an alternating magnetic field of a tag reader, a tag circuit obtains a corresponding electromagnetic wave through coupling, so as to generate voltage and current in an internal circuit of the tag. When the voltage increases to a threshold voltage of the tag, a tag storage electronic unit circuit is started to send a tag identity signal to the tag reader, and an identification of the tag information is completed through the decoding identification circuit 300.

The embodiment of the present disclosure adopts a frequency divider composed of triggers and an external crystal oscillation circuit, so that an output frequency after frequency division is more stable, accuracy is higher, and anti-interference ability of an output frequency signal is improved. In addition, the output is controlled by power switching tubes that are longitudinally symmetrical. Because an on resistance of the power tube is very small and switching time is short, conduction loss is smaller and efficiency is higher. Similarly, the RFID tag reading apparatus in the embodiment of the present disclosure can generate a resonance by adjusting parameters of the resonant circuit, so as to enhance a transmission power and effectively improve a reading distance of a reader.

A third embodiment of the present disclosure relates to an RFID tag information reading apparatus. The third embodiment is an embodiment with a further improvement being made based on the second embodiment, and main improvement lies in: the third embodiment further provides an apparatus for automatically obtaining an optimum access resonant capacitor.

Figure 3:
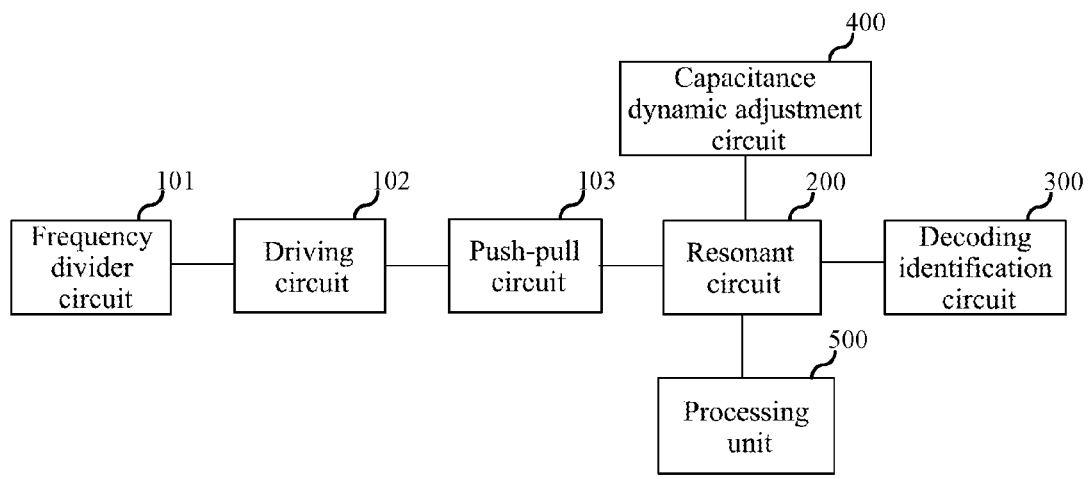
FIG. 3 is a schematic structural diagram of an RFID tag information reading apparatus according to a third embodiment of the present disclosure.

As shown in FIG. 3, the RFID tag information reading apparatus according to the embodiment of the present disclosure further includes a capacitance dynamic adjustment circuit 400 and a processing unit 500. The frequency divider circuit 101 outputs the frequency division signal to the driving circuit 102, the driving circuit 102 outputs the driving signal according to the frequency division signal, the push-pull circuit 103 alternately outputs the operation frequency signal according to the driving signal, and loads the operation frequency signal to the resonant circuit 200. The resonant capacitance of the resonant circuit 200 can be obtained through the capacitance dynamic adjustment circuit 400 (at this time, the inductance value of the resonant circuit is a fixed value). The resonant circuit 200 generates a resonance according to the operation frequency signal, output a high-voltage sine wave for being transmitted to the coil of the resonant circuit, and convert the high-voltage sine wave into an electromagnetic wave for radiating out through the coil.

A coil voltage of the tag reader resonant circuit reaches a maximum value during resonance. Therefore, the processing unit 500 can detect the coil voltage and connect different access resonant capacitors to the resonant circuit 200 respectively. When the coil voltage reaches the maximum value, the processing unit 500 judges that the resonant circuit generates resonance (at this time, the inductance value of the resonant circuit is a fixed value).

Figure 4:
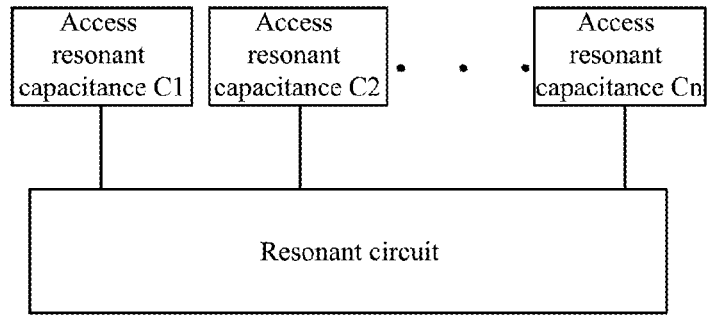
FIG. 4 is a schematic structural diagram of a capacitance dynamic adjustment circuit according to a third embodiment of the present disclosure.

Specifically, the capacitance dynamic adjustment circuit 400 is connected with the resonant circuit 200, and the processing unit 500 is connected with the resonant circuit 200, where the capacitance dynamic adjustment circuit includes multiple groups of capacitors. By connecting any group number of capacitors of multiple groups of capacitors of the capacitance dynamic adjustment circuit to the resonant circuit respectively, different access resonant capacitors can be obtained. For example, if the capacitance dynamic adjustment circuit includes 5 groups of capacitors, as shown in FIG. 4, there can be 32 different capacitor combination modes, and n=32 different access resonant capacitance values C1, C2 . . . C32 can be obtained. When the circuit is in a transmitting state, 32 different access resonant capacitors can be connected to the resonant circuit respectively, and 32 corresponding coil voltages can be obtained respectively. By sampling the coil voltage, such as performing analog to digital (AD) sampling method, the obtained sampling value is input to the processing unit for comparison, so as to determine a maximum value, then a access resonant capacitance corresponding to the maximum coil at this time can be determined as the resonant capacitance of the resonant circuit (at this time, the inductance value is a fixed value), so the purpose of automatically adjusting the access resonant capacitor to make it resonant is realized in this way.

When a passive electronic tag enters an alternating magnetic field of a tag reader, a tag circuit obtains a corresponding electromagnetic wave through coupling, so as to generate voltage and current in an internal circuit of the tag. When the voltage increases to a threshold voltage of the tag, a tag storage electronic unit circuit is started to send a tag identity signal to the tag reader, and an identification of the tag information is completed through the decoding identification circuit 300.

In the embodiment, different access resonant capacitors are connected through the capacitor dynamic adjustment circuit to obtain different coil voltages, and the access resonant capacitor corresponding to the maximum coil voltage is determined as the resonant capacitor, which realizes the purpose of automatically obtaining the optimum access resonant capacitor, so as to enhance the transmission power and greatly improve the reading distance.

A fourth embodiment of the present disclosure relates to an RFID tag information reading apparatus. The fourth embodiment is an embodiment with a further improvement being made based on any one of the first to third embodiments. The main improvement lies in: the fourth embodiment further provides a apparatus for releasing a DC component of the resonant circuit.

Figure 5:
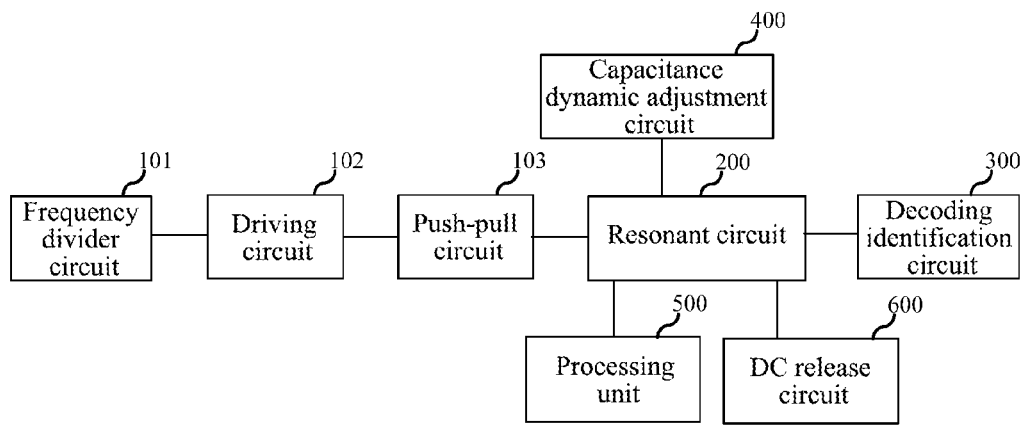
FIG. 5 is a schematic structural diagram of an RFID tag information reading apparatus according to a fourth embodiment of the present disclosure.

As shown in FIG. 5, the RFID tag information reading apparatus of the present embodiment further includes a DC release circuit 600 on the basis of the third embodiment.

Figure 6:
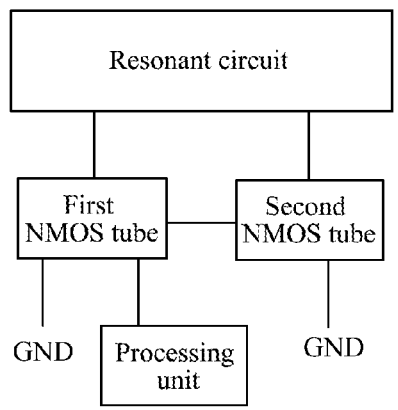
FIG. 6 is a schematic structural diagram of a DC release circuit according to a fourth embodiment of the present disclosure.

Specifically, the frequency divider circuit 101 outputs the frequency division signal to the driving circuit 102, the driving circuit 102 outputs the driving signal according to the frequency division signal, the push-pull circuit 103 alternately outputs the operation frequency signal according to the driving signal, and loads the operation frequency signal to the resonant circuit 200. The resonant capacitance of the resonant circuit 200 can be obtained through the capacitance dynamic adjustment circuit 400 (at this time, the inductance value of the resonant circuit is a fixed value). In addition, the resonant circuit 200 is also connected with the DC release circuit 600 for releasing the DC component on the coil of the resonant circuit through a loop. Specifically, as shown in FIG. 6, the DC release circuit includes a first NMOS tube and a second NMOS tube, where the first NMOS tube is connected with the second NMOS tube, the first NMOS tube and the second NMOS tube have one end grounded, and the first NMOS tube is also connected with the processing unit.

The resonant circuit 200 generates a resonance according to the operation frequency signal, output a high-voltage sine wave for being transmitted to the coil of the resonant circuit, and convert the high-voltage sine wave into an electromagnetic wave for radiating out through the coil. When a passive electronic tag enters an alternating magnetic field of a tag reader, a tag circuit obtains a corresponding electromagnetic wave through coupling, so as to generate voltage and current in an internal circuit of the tag. When the voltage increases to a threshold voltage of the tag, a tag storage electronic unit circuit is started to send a tag identity signal to the tag reader, and an identification of the tag information is completed through the decoding identification circuit 300.

The DC component on the coil will affect performance of the circuit. If the DC on the coil cannot be effectively released, it will be superimposed on an alternating signal, resulting in stagnant energy storage, hindering a change of magnetic flux and affecting a transformation of magnetic energy. Releasing the DC component on the coil in advance will help to improve the anti-interference ability of a system and increase the stability of the system.

A fifth embodiment of the present disclosure relates to an RFID tag information reading apparatus. The fifth embodiment is an embodiment with a further improvement being made based on any one of the first to fourth embodiments. The main improvement lies in: the fifth embodiment further provides a decoding identification circuit, specifically an HDX receiving and decoding circuit.

When a passive electronic tag enters an alternating magnetic field of a tag reader, a tag circuit obtains a corresponding electromagnetic wave through coupling, so as to generate voltage and current in an internal circuit of the tag. When the voltage increases to a threshold voltage of the tag, a tag storage electronic unit circuit is started to send a tag identity signal to the tag reader, and an identification of the tag information is completed through the decoding identification circuit.

Figure 7:
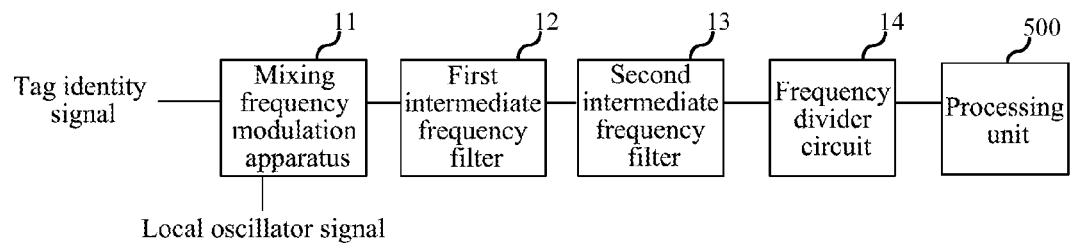
FIG. 7 is a schematic structural diagram of a half duplex (HDX) receiving and decoding circuit according to a fifth embodiment of the present disclosure.

As shown in FIG. 7, the tag identity signal sent by the passive electronic tag and a local oscillator signal generated by a timer of the processing unit load a weak tag identity signal of the passive electronic tag to an intermediate frequency 455 kHz through a mixing frequency modulation apparatus 11, and then send it to a frequency divider circuit 14 to realize frequency division output after two stages (a first intermediate frequency filter 12 and a second intermediate frequency filter 13) intermediate frequency amplification and filtering, and finally enter the processing unit 500 for capture and identification.

By decoding the tag identity signal through the HDX receiving and decoding circuit, the weak signal can be amplified and identified, so that the reading distance of the tag reader can reach more than 55 cm, which makes reading operation easier, and can be identified by approaching without deliberate alignment.

A sixth embodiment of the present disclosure relates to an RFID tag information reading apparatus. The sixth embodiment is an embodiment with a further improvement being made based on any one of the first to fourth embodiments. The main improvement lies in: the sixth embodiment further provides a decoding identification circuit, specifically an FDX-A decoding circuit.

When a passive electronic tag enters an alternating magnetic field of a tag reader, a tag circuit obtains a corresponding electromagnetic wave through coupling, so as to generate voltage and current in an internal circuit of the tag. When the voltage increases to a threshold voltage of the tag, a tag storage electronic unit circuit is started to send a tag identity signal to the tag reader, and an identification of the tag information is completed through the decoding identification circuit.

Figure 8:
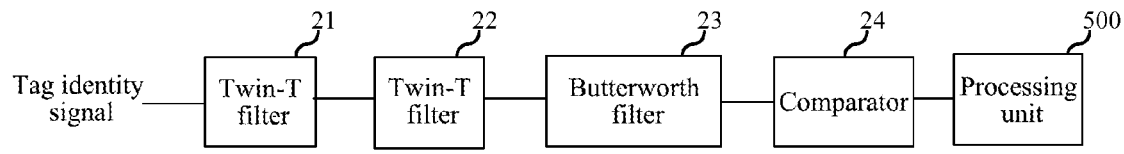
FIG. 8 is a schematic structural diagram of a full duplex-A (FDX-A) decoding circuit according to a sixth embodiment of the present disclosure.

As shown in FIG. 8, after envelope detection and sampling, the tag identity signal sent from the passive electronic tag enters a two-stage Twin-T double T-shaped filter (21, 22) designed by differential operational amplifier and a Butterworth filter 23, and then is restored into a rectangular wave signal through a operational amplifier comparator 24, and finally, enters the processing unit 500 for capture and identification.

By decoding the tag identity signal through the FDX-A decoding circuit, the weak signal can be amplified and identified, so that the reading distance of the tag reader can reach more than 27 cm, which makes the reading operation easier, and can be identified by approaching without deliberate alignment.

A seventh embodiment of the present disclosure relates to an RFID tag information reading apparatus. The sixth embodiment is an embodiment with a further improvement being made based on any one of the first to fourth embodiments. The main improvement lies in: the seventh embodiment further provides a decoding identification circuit, specifically an FDX-B decoding circuit.

When a passive electronic tag enters an alternating magnetic field of a tag reader, a tag circuit obtains a corresponding electromagnetic wave through coupling, so as to generate voltage and current in an internal circuit of the tag. When the voltage increases to a threshold voltage of the tag, a tag storage electronic unit circuit is started to send a tag identity signal to the tag reader, and an identification of the tag information is completed through the decoding identification circuit.

Figure 9:
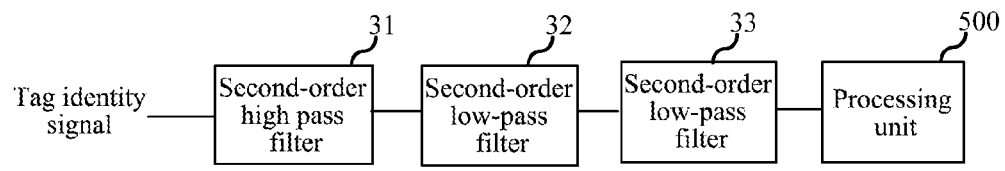
FIG. 9 is a schematic structural diagram of a full duplex-B (FDX-B) decoding circuit according to a seventh embodiment of the present disclosure.

As shown in FIG. 9, after envelope detection and sampling, the tag identity signal sent from the passive electronic tag enters a second-order high pass filter 31 designed by differential operational amplifier, then extracts a useful tag identity signal through a two-order second-order low-pass filter (32, 33) designed by differential operational amplifier, and finally enters the processing unit 500 to restore TAG identity information after AD sampling.

By decoding the tag identity signal through the FDX-B decoding circuit, the weak signal can be amplified and identified, so that the reading distance of the tag reader can reach more than 27 cm, which makes the reading operation easier, and can be identified by approaching without deliberate alignment.

The low-frequency passive electronic tag identification reading device of the present disclosure can be applied to animal tags conforming to ISO11784/5 of various shapes and specifications in animal husbandry, and the actual use effect is remarkable. For commonly testing ear tags of cattle and sheep, HDX can reach above 55 cm and FDX-B/FDX-A can reach above 27 cm.

In addition, the tag identification reading device is easy to carry, does not need battery power, and is convenient for farmers and herdsmen to operate, it can read when approached without deliberate alignment, responds quickly when reading the tag, reads at the touch of a button, and automatically shuts down after idle for a period of time (e.g. 10 minutes). The tag identification reading device is equipped with Bluetooth and wireless fidelity (WiFi) wireless transmission functions, which can realize mobile app viewing, handheld printer to print tags, and connect to background server for data upload, registration and management functions. At the same time, it is equipped with a serial port universal serial bus (USB) to connect a computer to realize data storage function and management functions.

An eighth embodiment of the present disclosure relates to an RFID tag information reading method. In the embodiment, the RFID tag reading device includes: a signal management circuit, a resonant circuit and a decoding identification circuit; where the signal management circuit is connected with the resonant circuit, and the resonant circuit is connected with the decoding identification circuit; the signal management circuit is configured to output an operation frequency signal; the resonant circuit is configured to receive the operation frequency signal, adjust a capacitance value and an inductance value of the resonant circuit according to the operation frequency signal, so that the resonant circuit generates a resonance for generating a sine wave signal at a frequency point of the operation frequency signal; the resonant circuit is further configured to generate an electromagnetic wave from the sine wave signal, radiate the electromagnetic wave to an RFID tag, and trigger the RFID tag to return a tag identity signal; the decoding identification circuit is configured to identify RFID tag information according to the tag identity signal returned by the RFID tag.

Figure 10:
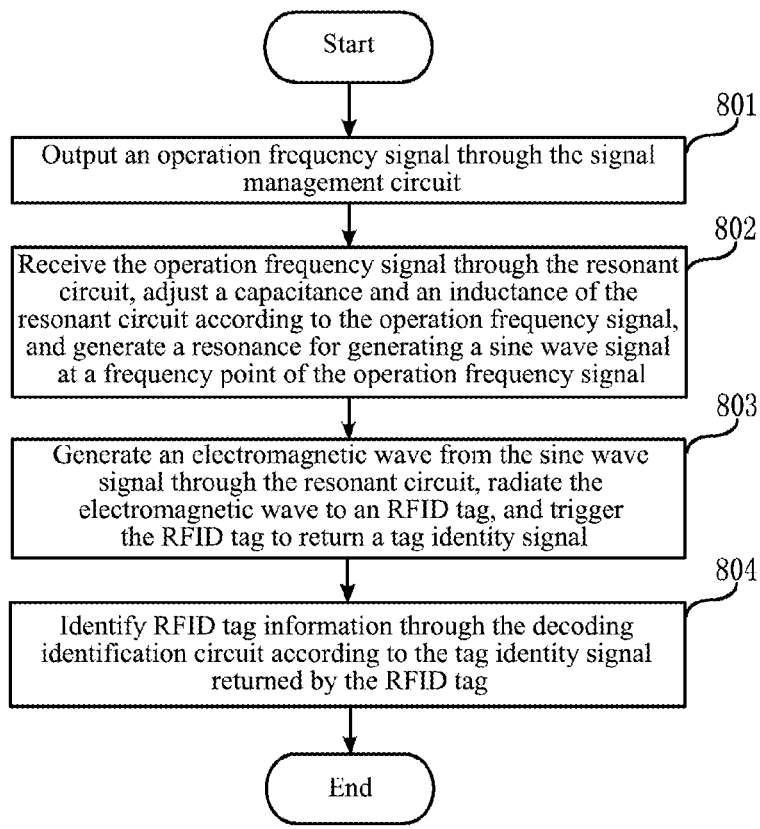
FIG. 10 is a schematic flowchart of an RFID tag information reading method according to an eighth embodiment of the present disclosure.

The following content is a specific description of the implementation details of the RFID tag information reading method of this embodiment, and is only provided for convenience of understanding and is not necessary for implementing this solution. The specific implementation flow of the RFID tag information reading method is shown in FIG. 10 and includes the following steps.

Step 801: output an operation frequency signal through the signal management circuit.

Specifically, the signal management circuit outputs the operation frequency signal, and the tag reader is usually used in the low frequency band. For example, the usual operation frequency of the tag reader is 125 kHz and 134.2 khz. In practical application, it can be obtained by a signal generator or a signal management circuit composed of a frequency divider circuit, a driving circuit and a push-pull circuit.

Step 802: receive the operation frequency signal through the resonant circuit, adjust a capacitance value and an inductance value of the resonant circuit according to the operation frequency signal, and generate a resonance for generating a sine wave signal at a frequency point of the operation frequency signal.

Specifically, the operation frequency signal output through the signal management circuit 100 is loaded on a LC resonant circuit (LC represents inductance and capacitance respectively). In order to make the LC resonant circuit resonate at a frequency point of the operation frequency signal, that is, resonate at a frequency point frequency f=125 kHz or 134.2 kHz, it is necessary to adjust the capacitance value and inductance value of the LC resonant circuit. A relationship between frequency point frequency and inductance and capacitance can be expressed as $$f = \frac{1}{2\pi\sqrt{LC}},$$

that is LC are variables, that is, the frequency point frequency can be matched by changing LC. In actual product applications, considering errors of capacitance and inductance and other parasitic capacitance and inductance factors on a circuit board, there is a deviation between an actual connected capacitance and inductance and a theoretical value. If the capacitance and inductance cannot match the frequency of the frequency point, a frequency point offset will occur, which may lead to transmission loss and circuit heating, resulting in an increased decoding error and an unstable signal. In this case, it is necessary to adjust the capacitance and inductance according to the frequency of the frequency point according to an actual situation to make a resonant capacitor resonate at the frequency point. Generally speaking, to adjust the capacitance and inductance, one variable needs to be determined before adjusting another variable. In an actual product, the inductance L cannot be changed at will, and L is usually a fixed value, so only the capacitance C needs to be adjusted to match a corresponding frequency of the frequency point.

Step 803: generate an electromagnetic wave from the sine wave signal through the resonant circuit, radiate the electromagnetic wave to an RFID tag, and trigger the RFID tag to return a tag identity signal.

Specifically, after resonance occurs at the frequency point, the resonant circuit generates a high-voltage sine wave, and then radiates the electromagnetic wave generated by the high-voltage sine wave, so that the RFID tag receives the electromagnetic wave and returns the tag identity signal through the electromagnetic wave.

Step 804: identify RFID tag information through the decoding identification circuit according to the tag identity signal returned by the RFID tag.

Specifically, when a passive electronic tag enters an alternating magnetic field of a tag reader, a tag circuit obtains a corresponding electromagnetic wave through coupling, so as to generate voltage and current in an internal circuit of the tag. When the voltage increases to a threshold voltage of the tag, a tag storage electronic unit circuit is started to send a tag identity signal to the tag reader, and an identification of the tag information is completed through the decoding identification circuit.

A ninth embodiment of the present disclosure relates to an RFID tag information reading method. The ninth embodiment is an embodiment with a further improvement being made based on the eighth embodiment, and the main improvement lies in: the ninth embodiment of the present disclosure specifically provides a specific implementation method for adjusting the capacitance value and inductance value of the resonant circuit according to the operation frequency signal.

The RFID tag information reading method according to the embodiment of the present disclosure includes the following steps.

Step 901: output an operation frequency signal through the signal management circuit.

Figure 11:
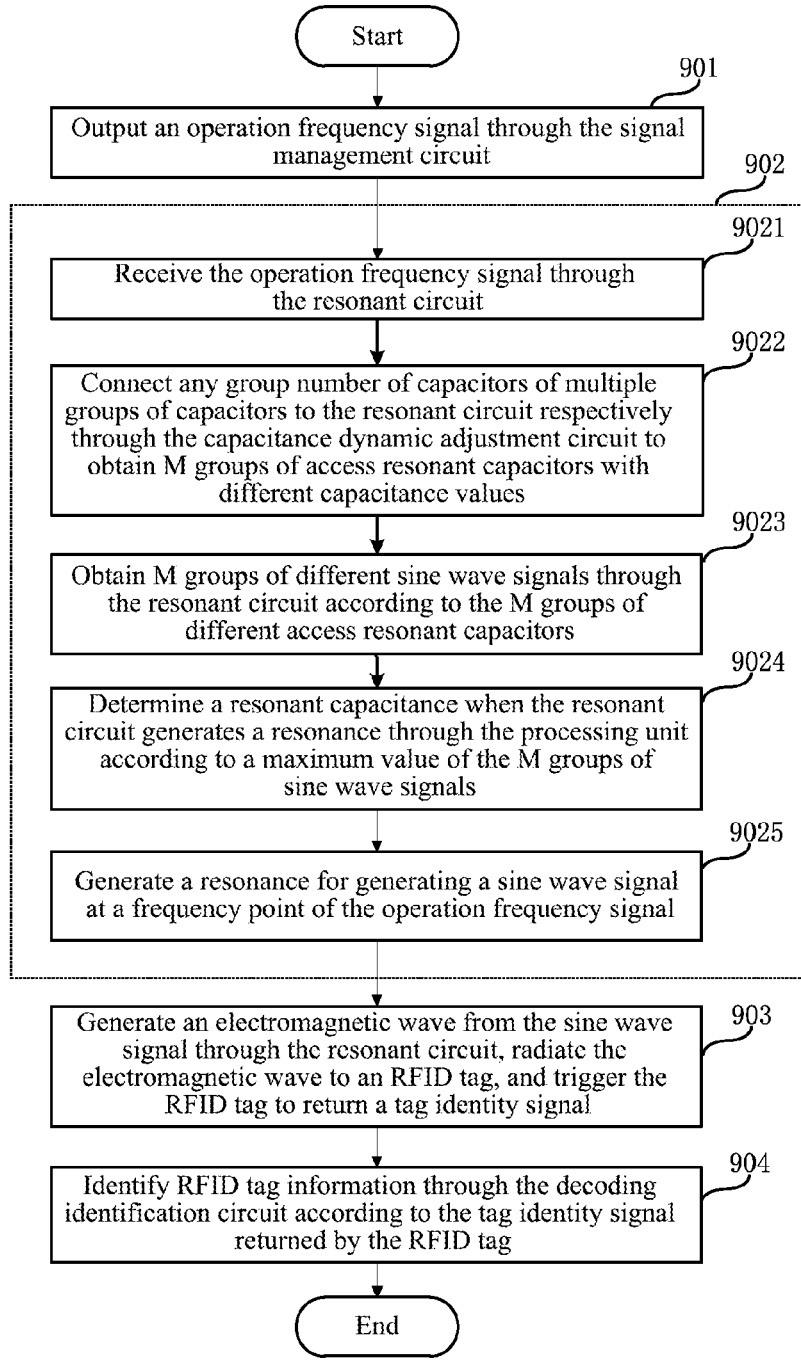
FIG. 11 is a schematic flowchart of an RFID tag information reading method according to a ninth embodiment of the present disclosure.

Step 902: as shown in FIG. 11, it includes the following sub steps.

Sub step 9021: receive the operation frequency signal through the resonant circuit.

Specifically, the operation frequency signal output by the signal management circuit is input to the resonance signal.

Sub step 9022: connect any group number of capacitors of multiple groups of capacitors to the resonant circuit respectively through the capacitance dynamic adjustment circuit to obtain M groups of access resonant capacitors with different capacitance values.

Specifically, the capacitance dynamic adjustment circuit includes multiple groups of capacitors. In the embodiment of the present disclosure, by connecting any group number of capacitors of multiple groups of capacitors of the capacitance dynamic adjustment circuit to the resonant circuit respectively, M groups of different access resonant capacitors can be obtained. For example, if the capacitance dynamic adjustment circuit includes 5 groups of capacitors, there can be 32 different and arbitrary capacitor combination modes, and 32 groups of different access resonant capacitance values C1, C2 . . . C32 can be obtained.

Sub step 9023: obtain M groups of different sine wave signals through the resonant circuit according to the M groups of different access resonant capacitors.

Specifically, according to M groups of different access resonant capacitors, such as 32 groups listed in step 9022, when the circuit is in a transmitting state, 32 different groups of access resonant capacitors can be connected to the resonant circuit respectively, and 32 groups of different sine wave signals and 32 groups of corresponding coil voltages can be obtained respectively.

Sub step 9024: determine a resonant capacitance when the resonant circuit generates a resonance through the processing unit according to a maximum value of the M groups of sine wave signals.

Specifically, when the circuit is in the transmitting state, by sampling the coil voltage, such as performing AD analog-to-digital sampling, the voltage AD values of M groups of different coils are obtained, and a maximum coil voltage can be determined by inputting the AD values to the processing unit for comparison, and the corresponding access resonant capacitance is determined as the resonant capacitance when the resonant circuit resonates (at this time, the inductance value is a fixed value).

Sub step 9025: generate a resonance for generating a sine wave signal at a frequency point of the operation frequency signal.

Specifically, according to the resonant capacitance obtained in step 9024, the resonant circuit generates resonance for generating the sine wave signal at the frequency point of the operation frequency signal, thereby completing the process of automatically adjusting the access resonant capacitance to cause it generates a resonance.

Step 903: generate an electromagnetic wave from the sine wave signal through the resonant circuit, radiate the electromagnetic wave to an RFID tag, and trigger the RFID tag to return a tag identity signal.

Step 904: identify RFID tag information through the decoding identification circuit according to the tag identity signal returned by the RFID tag.

Steps 901, 903 and 904 are the same as steps 801, 803 and 804 in the first embodiment, and will not be repeated here.

In the embodiment, different access resonant capacitors are connected through the capacitor dynamic adjustment circuit to obtain different coil voltages, and the access resonant capacitor corresponding to the maximum coil voltage is determined as the resonant capacitor, which realizes the purpose of automatically obtaining the optimum access resonant capacitor, so as to enhance the transmission power and greatly improve the reading distance.

The step division of the above methods is only for clear description. During implementation, they can be combined into one step or split some steps into multiple steps, as long as they include the same logical relationship, they are within the protection scope of the present patent; adding unimportant modifications or introducing unimportant design into the algorithm or process without changing the core design of the algorithm and process are within the protection scope of the patent.

Those skilled in the art can understand that the above implementations are specific embodiments to realize the present disclosure, and in practical application, various changes can be made in form and details without departing from the spirit and scope of the present disclosure.

What is claimed is:

1. A radio frequency identification (RFID) tag information reading apparatus, comprising:
a signal management circuit, a resonant circuit and a decoding identification circuit;
wherein the signal management circuit is connected with the resonant circuit, and the resonant circuit is connected with the decoding identification circuit;
the signal management circuit is configured to output an operation frequency signal;
the resonant circuit is configured to receive the operation frequency signal, adjust a capacitance value and an inductance value of the resonant circuit according to the operation frequency signal, so that the resonant circuit generates a resonance for generating a sine wave signal at a frequency point of the operation frequency signal; the resonant circuit is further configured to generate an electromagnetic wave from the sine wave signal, radiate the electromagnetic wave to an RFID tag, and trigger the RFID tag to return a tag identity signal;

the decoding identification circuit is configured to identify RFID tag information according to the tag identity signal returned by the RFID tag;

further comprising a capacitance dynamic adjustment circuit and a processing unit, wherein the resonant circuit is respectively connected with the capacitance dynamic adjustment circuit and the processing unit, and the capacitance dynamic adjustment circuit comprises multiple groups of capacitors;

the capacitance dynamic adjustment circuit is configured to connect any group number of capacitors of the multiple groups of capacitors to the resonant circuit respectively to obtain M groups of access resonant capacitors with different capacitance values, and the resonant circuit obtains M groups of different sine wave signals according to the M groups of different access resonant capacitors;

the processing unit determines a resonant capacitance of the resonant circuit according to a maximum value of the M groups of sine wave signals, wherein an inductance value of the resonant circuit is set to a fixed value, and M is a positive integer greater than or equal to 2.

2. The RFID tag information reading apparatus according to claim 1, further comprising a direct current (DC) release circuit, wherein the DC release circuit is connected with the resonant circuit; the DC release circuit is configured to release a DC component of the resonant circuit through a loop.

3. The RFID tag information reading apparatus according to claim 2, wherein the signal management circuit comprises a frequency divider and an external crystal oscillation circuit;

the external crystal oscillation circuit is connected with the frequency divider, and is configured to provide a preset oscillation frequency input to the frequency divider;

the frequency divider is configured to perform 2 to N frequency division on a crystal oscillator of the external crystal oscillation circuit to obtain a frequency point frequency of the operation frequency signal;

the frequency divider comprises N triggers; an output of an N−1th trigger is an input of a Nth trigger, and a frequency of an output signal of the Nth trigger is half of a frequency of an output signal of the N−1th trigger; wherein the operation frequency signal is an output signal of a last trigger comprised in the frequency divider, and N is a positive integer greater than or equal to 2.

4. The RFID tag information reading apparatus according to claim 1, wherein the decoding identification circuit comprises a decoding circuit and an identification circuit;

the decoding circuit comprises: a mixer, an intermediate frequency filter and a frequency divider circuit;

the mixer is connected with the intermediate frequency filter, and the intermediate frequency filter is connected with the frequency divider circuit;

the mixer is configured to mix the tag identity signal and a local oscillator signal sent by the identification circuit to obtain an intermediate frequency signal with the tag identity signal;

the intermediate frequency filter is configured to preform two-stage amplifying and filtering on the intermediate frequency signal to obtain an intermediate frequency amplified signal; the frequency divider circuit is configured to divide and output the intermediate frequency amplified signal;

the identification circuit is configured to identify the tag information according to the intermediate frequency amplified signal after frequency division.

5. The RFID tag information reading apparatus according to claim 1, wherein the decoding identification circuit comprises a decoding circuit and an identification circuit;

the decoding circuit comprises: a two-stage Twin-T filter, a Butterworth filter and a comparator;

the two-stage Twin-T filter is connected with the Butterworth filter, and the Butterworth filter is connected with the comparator;

the two-stage Twin-T filter and the Butterworth filter are configured to filter the tag identity signal, and the comparator is configured to restore the filtered tag identity signal into a rectangular wave signal;

the identification circuit is configured to identify the tag information according to the rectangular wave signal.

6. The RFID tag information reading apparatus according to claim 1, wherein the decoding identification circuit comprises a decoding circuit and an identification circuit;

the decoding circuit comprises: a two-order high-pass filter and a two-order low-pass filter;

the two-order high-pass filter is connected with the two-order low-pass filter;

the two-order high-pass filter and the two-order low-pass filter are configured to filter the tag identity signal;

the identification circuit is configured to identify the tag information according to the filtered tag identity signal.

7. A radio frequency identification (RFID) tag information reading method, applied to an RFID tag reading apparatus, and the RFID tag reading apparatus comprises: a signal management circuit, a resonant circuit and a decoding identification circuit; the signal management circuit is connected with the resonant circuit, and the resonant circuit is connected with the decoding identification circuit;

the RFID tag reading method comprises:

outputting an operation frequency signal through the signal management circuit;

receiving the operation frequency signal through the resonant circuit, adjusting a capacitance value and an inductance value of the resonant circuit according to the operation frequency signal, and generating a resonance for generating a sine wave signal at a frequency point of the operation frequency signal; generating an electromagnetic wave from the sine wave signal through the resonant circuit, radiating the electromagnetic wave to an RFID tag, and triggering the RFID tag to return a tag identity signal; and identifying RFID tag information through the decoding identification circuit according to the tag identity signal returned by the RFID tag;

the RFID tag reading apparatus further comprises a capacitance dynamic adjustment circuit and a processing unit, wherein the resonant circuit is respectively connected with the capacitance dynamic adjustment circuit and the processing unit, and the capacitance dynamic adjustment circuit comprises multiple groups of capacitors;

the adjusting the capacitance value and the inductance value of the resonant circuit according to the operation frequency signal specifically comprises:

connecting any group number of capacitors of the multiple groups of capacitors to the resonant circuit respectively through the capacitance dynamic adjustment circuit to obtain M groups of access resonant capacitors with different capacitance values;

obtaining M groups of different sine wave signals through the resonant circuit according to the M groups of different access resonant capacitors;

determining a resonant capacitance when the resonant circuit generates a resonance through the processing unit according to a maximum value of the sine wave signals, wherein an inductance value of the resonant circuit is set to a fixed value, and M is a positive integer greater than or equal to 2.

8. The RFID tag information reading method according to claim 7, further comprising:

when it is detected that an idle time exceeds a first threshold, shutting off the RFID tag reading apparatus.

\* \* \* \* \*